United States Patent [19]
Gonzales

[11] Patent Number: 5,497,017
[45] Date of Patent: Mar. 5, 1996

[54] DYNAMIC RANDOM ACCESS MEMORY ARRAY HAVING A CROSS-POINT LAYOUT, TUNGSTEN DIGIT LINES BURIED IN THE SUBSTRATE, AND VERTICAL ACCESS TRANSISTORS

[75] Inventor: Fernando Gonzales, Boise, Id.

[73] Assignee: Micron Technology, Inc., Boise, Id.

[21] Appl. No.: 378,424

[22] Filed: Jan. 26, 1995

[51] Int. Cl.[6] .......................... H01L 27/108; H01L 29/76
[52] U.S. Cl. .............. 257/306; 257/302; 257/330; 257/382
[58] Field of Search .................. 257/306, 302, 257/330

[56] References Cited

U.S. PATENT DOCUMENTS

| | | | |
|---|---|---|---|
| 4,974,060 | 11/1990 | Ogasawara | 257/302 |
| 5,276,343 | 1/1994 | Kumagai et al. | 257/306 |
| 5,281,837 | 1/1994 | Kohyama | 257/302 |
| 5,410,169 | 4/1995 | Yamamoto et al. | 257/306 |

*Primary Examiner*—Robert P. Limanek
*Attorney, Agent, or Firm*—Holland & Hart; Angus C. Fox, III

[57] ABSTRACT

This invention is a DRAM array having stacked-capacitor cells of potentially $4F^2$ surface area (F being the photolithographic minimum feature width), and a 5-mask process for fabricating such an array. The array has a cross-point cell layout (i.e., a memory cell is located at each intersection of each digit line and each word line) and tungsten digit lines formed using a damascene process buried in the substrate. Each cell in the array has a vertical transistor, with the source/drain regions and channel region of the transistor being formed from epitaxially grown single crystal silicon. The stacked capacitor is fabricated on top of the vertical transistor.

19 Claims, 16 Drawing Sheets

DYNAMIC RANDOM ACCESS MEMORY ARRAY HAVING A CROSS-POINT LAYOUT, TUNGSTEN DIGIT LINES BURIED IN THE SUBSTRATE, AND VERTICAL ACCESS TRANSISTORS

FIELD OF THE INVENTION

This invention relates to dynamic random access memories and, more particularly, to compact cell array layouts involving vertical access transistors. The memory array disclosed herein has a cross-point layout, tungsten digit lines buried in the substrate, and vertical access transistors having channel regions formed in epitaxially-grown single crystal silicon.

BACKGROUND OF THE INVENTION

Since the early 1970s, a new generation of dynamic random access memory (DRAM) circuits has been developed approximately every four years. Each generation has been characterized by a four-fold density increase over the preceding generation. This has been accomplished by using photolithographic processes of ever greater resolution, by designing the individual memory cells so that the cell capacitor stores charge vertically rather than horizontally, and by maintaining sufficient cell capacitance through the use of high-performance cell dielectrics and three-dimensional capacitor structures. Thus, a cell in each new DRAM generation takes up less chip real estate than those of former generations.

The minimum size of features and spaces that a given piece of photolithographic equipment can produce is directly related to its resolution capability. The sum of minimum feature width (F) and minimum space width (S) producible with a given piece of photolithographic equipment is generally referred to as "minimum pitch". Since, for practical purposes, F can be considered to be equal to S, minimum pitch is, therefore, approximately equal to double the minimum feature width, or 2F. Using contemporary photolithography techniques, one minimum-width line (feature) and one minimum-width space may be defined for a given minimum pitch.

In a contemporary DRAM cell having conventional folded digit line architecture, at least two word lines and two spaces between word lines (a total width of 4F) must be created within the X-direction width of a cell. In the Y-direction, a digit line and a space between digit lines are required. Thus, total cell area is 4F (the X-direction width) multiplied by 2F (the Y-direction width), or $8F^2$. Contemporary 16-megabit DRAMs are typically fabricated with photolithographic processes having 0.3–0.5 μm minimum feature resolution. Thus, the area of an average $8F^2$ 16-megabit DRAM cell is about 0.75–2.0 μm².

If all structures within a DRAM cell are constructed on top of one another, and a cross-point array is employed, then the absolute minimum size of a cell will be 2F by 2F, or $4F^2$. Although, the cross-point array architecture was abandoned at the 256-kilobyte generation by virtually all DRAM manufacturers due to the noise levels inherent in open digit line architecture normally associated with cross-point cell arrays, it may experience a renaissance due to the compact nature of the layout and new techniques for reducing variations in signal strength associated with the open digit line architecture. Although $4F^2$ DRAM cell designs have been suggested and patented, most (if not all) have required a cell structure having a trench capacitor, a vertical access transistor, and a digit line contact on top of the transistor. Most DRAM manufacturers have forsaken trench capacitors in favor of stacked capacitors because of capacitor leakage associated with crystal defects introduced into the substrate by the trenching operation. What is needed is a $4F^2$ cell design which incorporates a stacked capacitor.

SUMMARY OF THE INVENTION

This invention is a DRAM array with cells having a size as small as $4F^2$ (F being the minimum feature size for a given photolithographic process), and also a process for fabricating the DRAM array. The array has a cross-point cell layout (i.e., a memory cell is located at each intersection of a digit line and a word line) and tungsten digit lines formed using a damascene process buried in the substrate. Each cell in the array has an access transistor with a vertical channel, the channel being formed from epitaxially grown single crystal silicon. The stacked capacitor is fabricated on top of the transistor.

The process begins by forming a series of parallel trenches in a lightly-doped P-type silicon substrate. A first silicon dioxide layer is then formed, which covers the upper surface of the substrate and also lines the trenches. The trenches are then filled with CVD tungsten. A chemical mechanical polishing step then removes all tungsten except that which in the trenches. A patch of oxide is removed adjacent one edge of each digit line at each cell location. A first selective epitaxial growth (SEG) step achieves contact between the silicon and the edge of the digit line. The epitaxially-grown silicon is doped heavily with an N-type impurity either in-situ during growth or by implantation following growth. A second silicon dioxide layer is then deposited and patterned so that insulative strips cover each digit line. Using a second SEG step, an unbroken lightly-doped P-type layer is grown which covers the digit lines and makes contact with the heavily-doped N-type regions. Channels are then etched in the SEG P-type layer. Silicon dioxide spacers are then formed on the walls of the channels. The spacer on one wall of each channel is then removed. A gate oxide layer is formed on the exposed wall of each channel. A polysilicon deposition step and etch-back forms word lines in each channel. A third silicon dioxide layer is formed, by deposition or thermal oxidation, and then etched to form a grid exposing rectangular regions of the SEG P-type layer which overlie the SEG N+ below the SEG P-type layer. The rectangular regions are then heavily doped by implanting with an N-type impurity. Cell capacitors are then fabricated on top of the rectangular regions, with the storage node of each capacitor being in contact therewith. The capacitors are preferably of the container type, but other types of stacked capacitors can also be integrated into the process flow.

Figure 1:
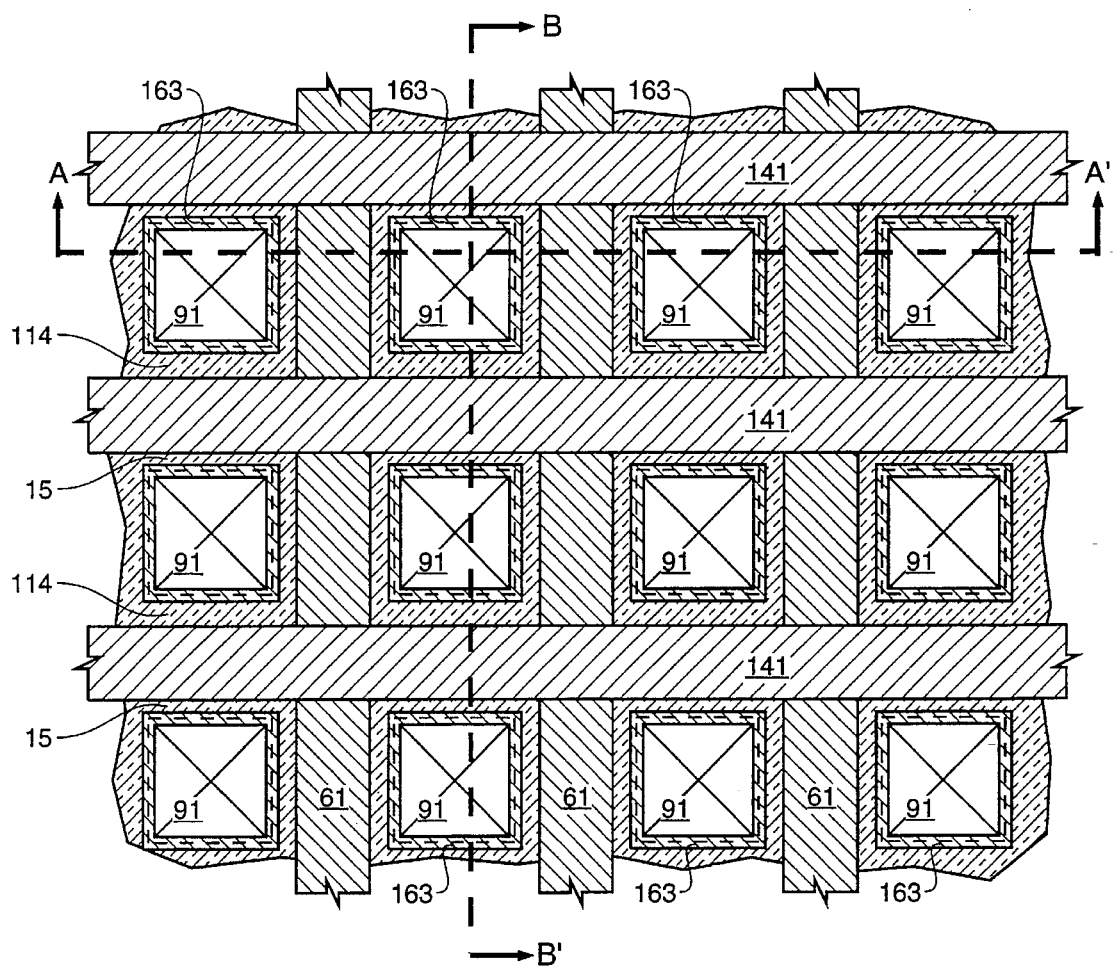
FIG. 1 is a top plan view (also known as a layout) of the new cross-point DRAM array.

Drawings with an A suffix (e.g., 2A, 5A, 9A, etc.) depict cross-sectional views taken through line A—A of FIG. 1, which is in a direction parallel to the word lines. Drawings with a B suffix (e.g., 2B, 6B, 14B, etc.) depict cross-sectional views taken through line B—B of FIG. 1, which is in a direction perpendicular to digit lines and parallel to the word lines.

Figure 2A:
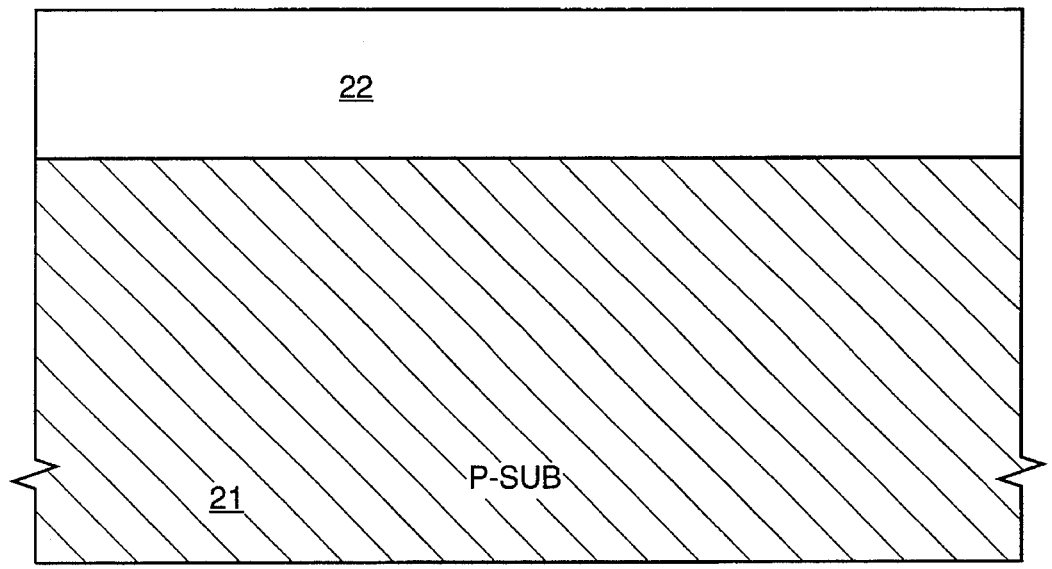
Figure 2B:
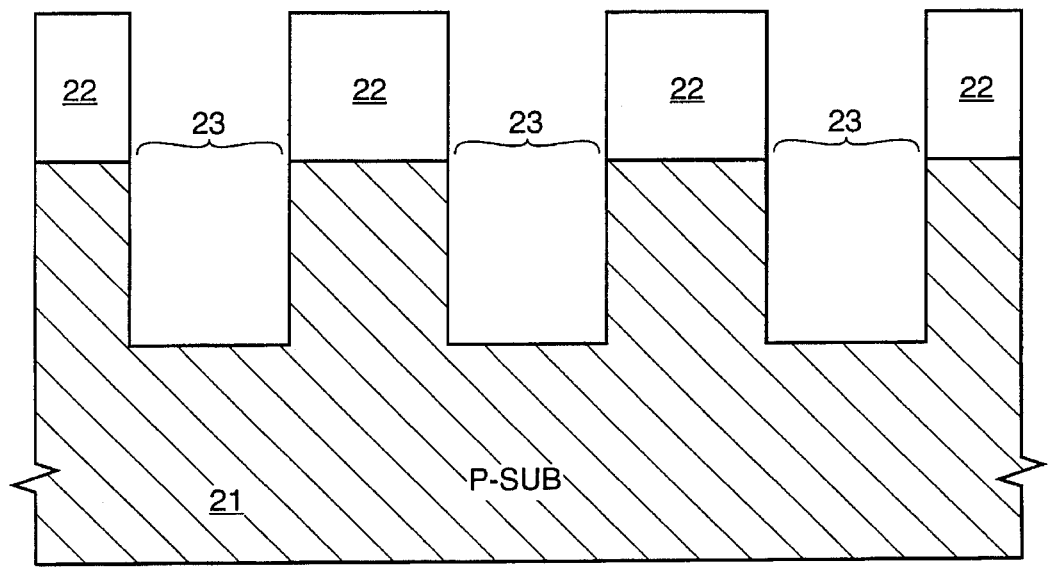
Figure 3A:
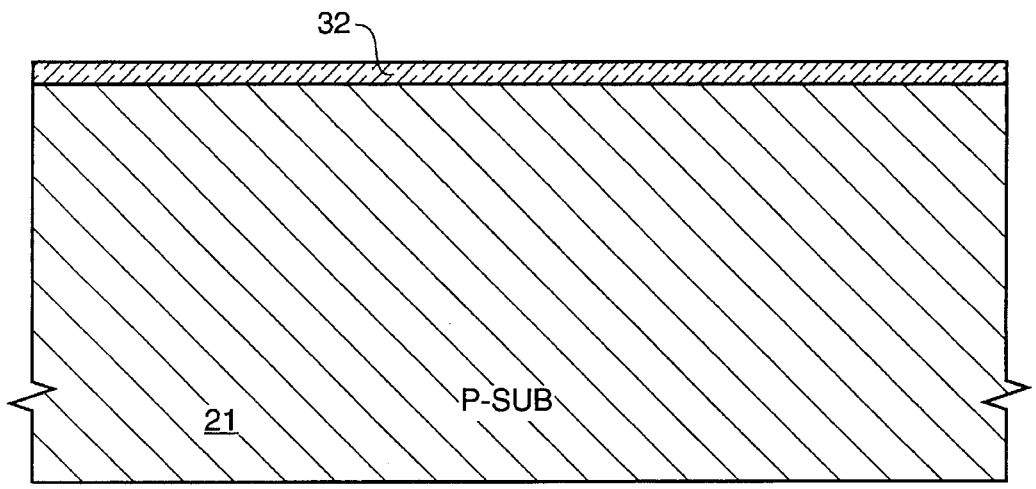
Figure 3B:
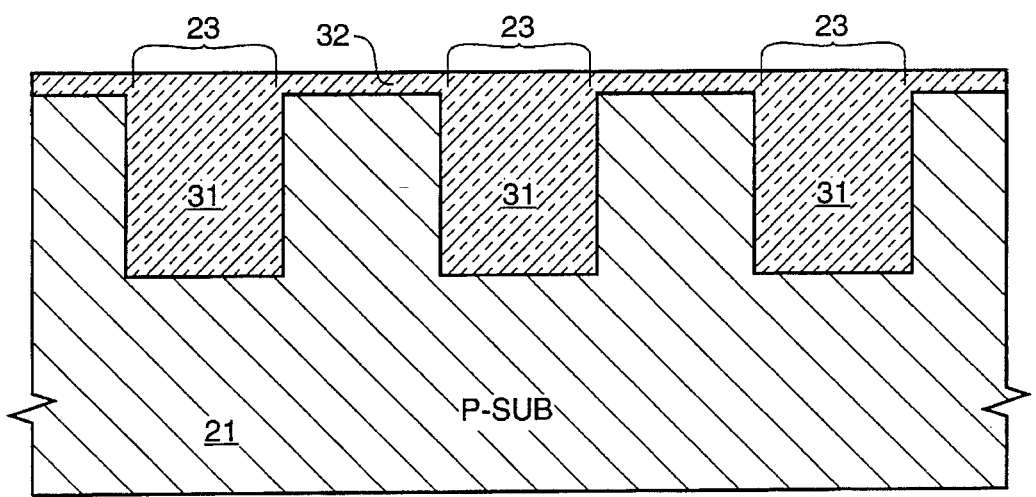
Figure 4A:
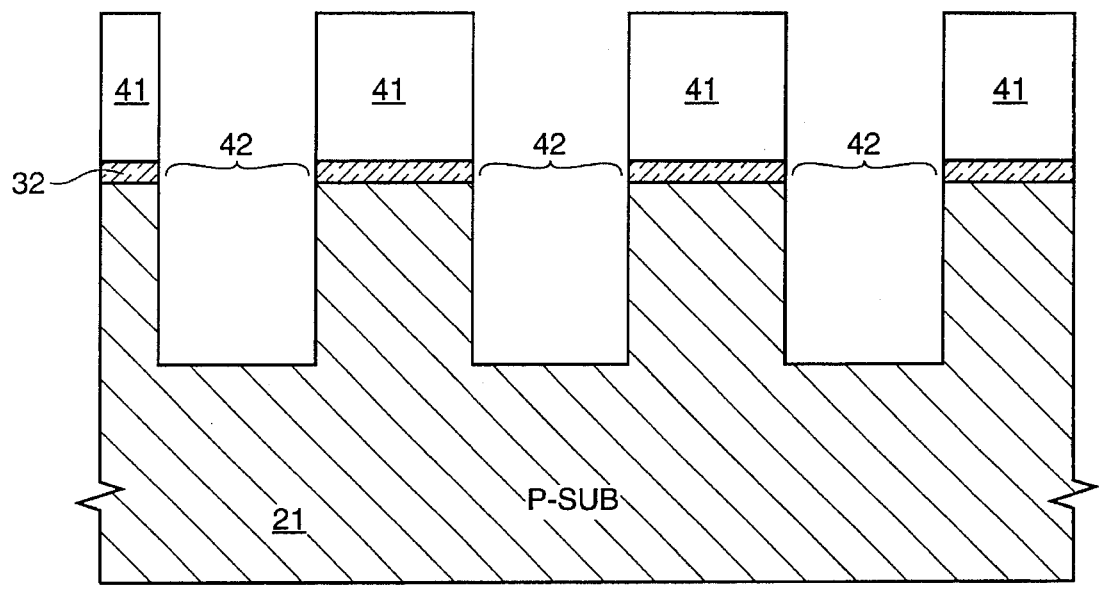
Figure 4B:
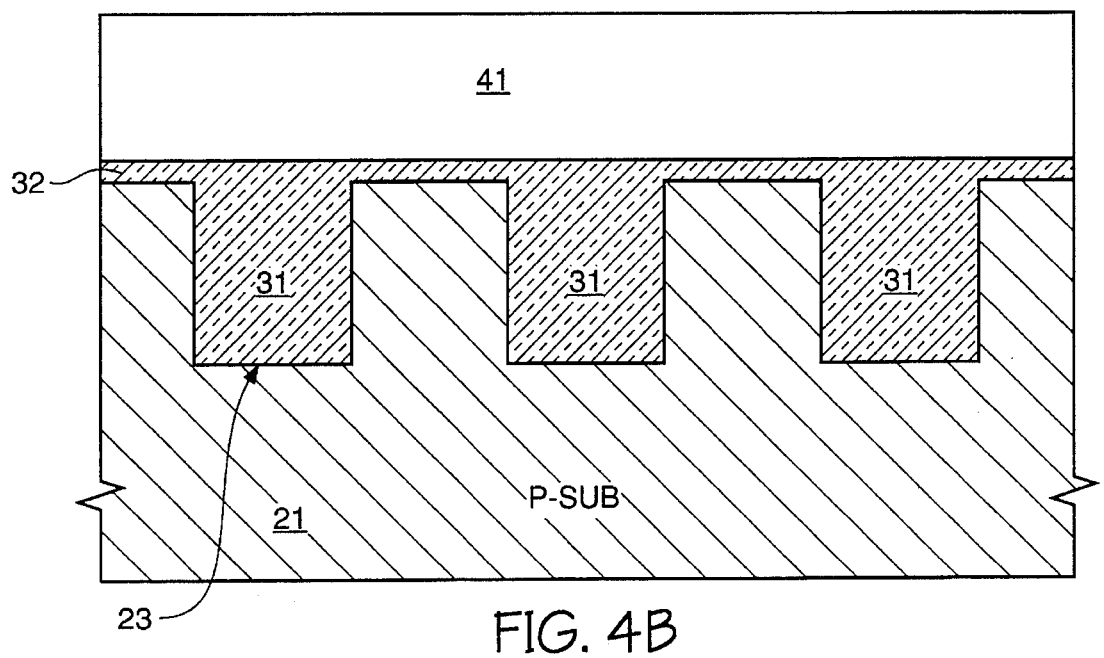
Figure 5A:
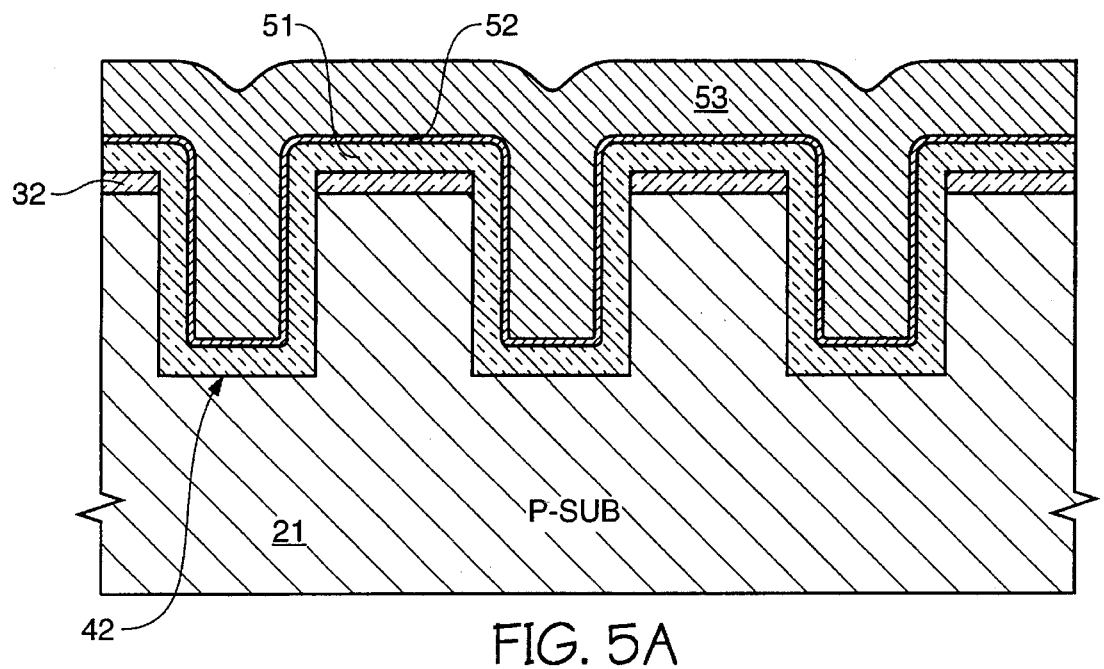
Figure 5B:
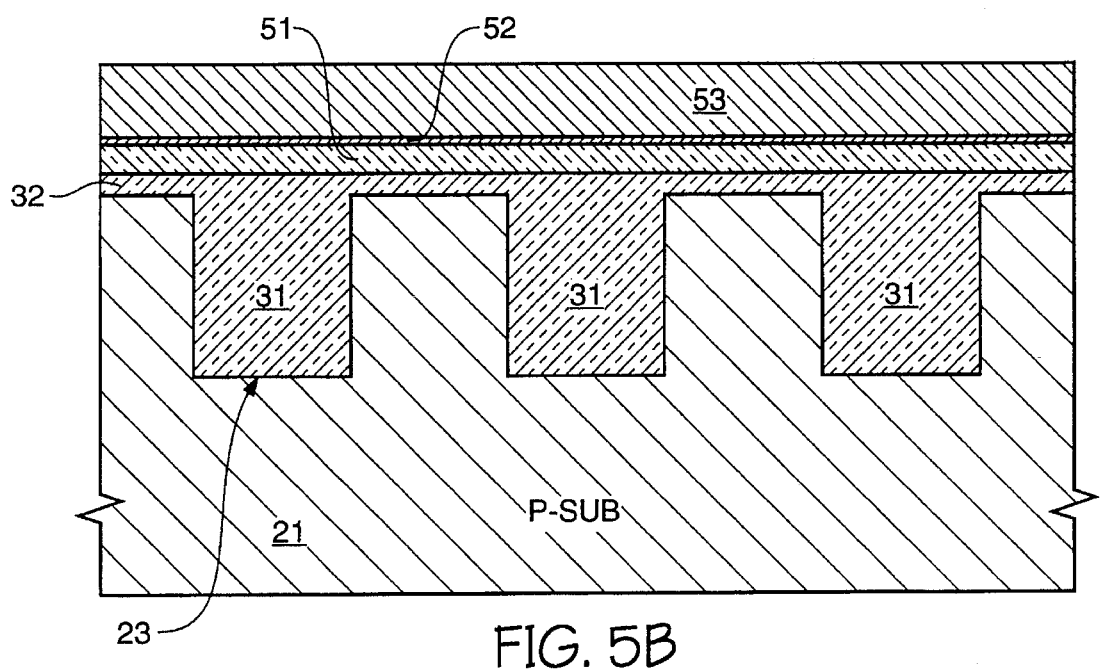
Figure 6A:
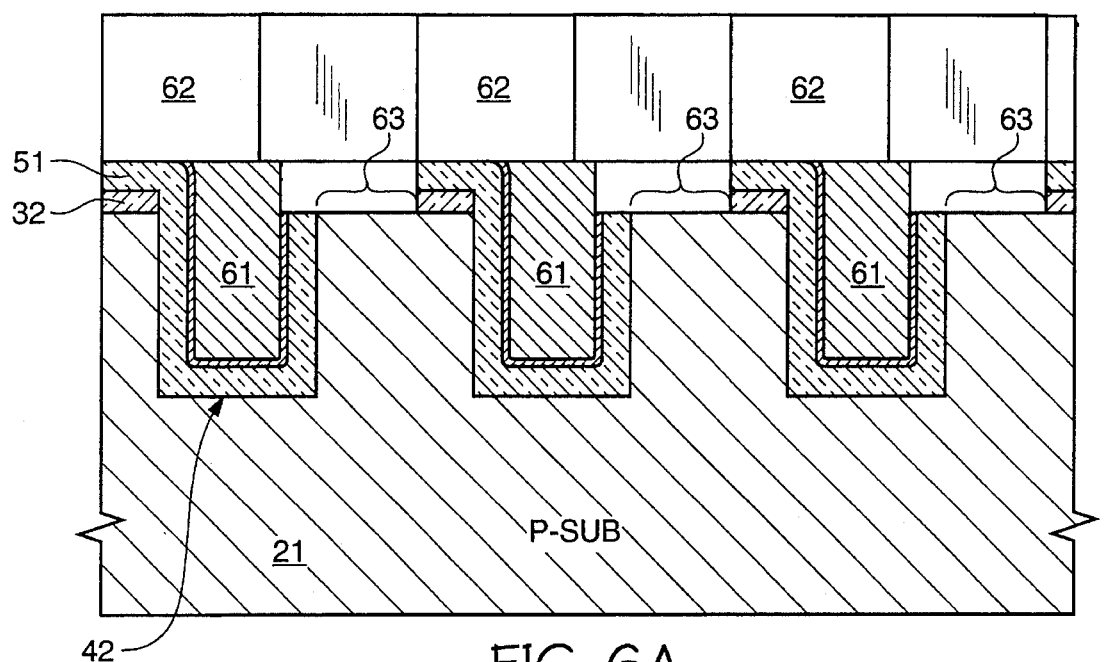
Figure 6B:
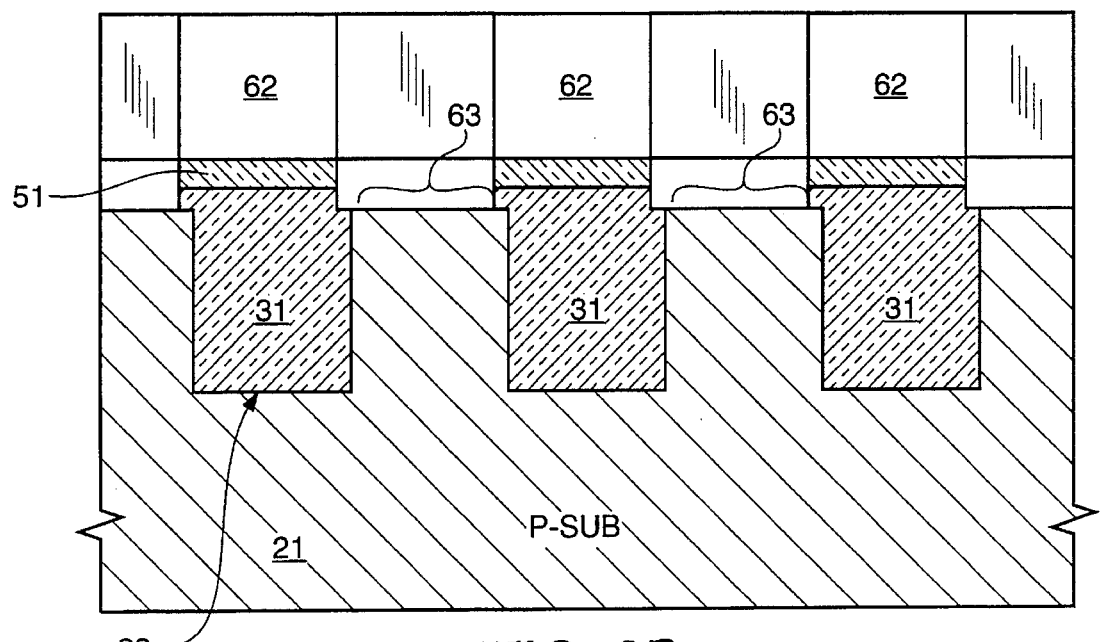
Figure 7A:
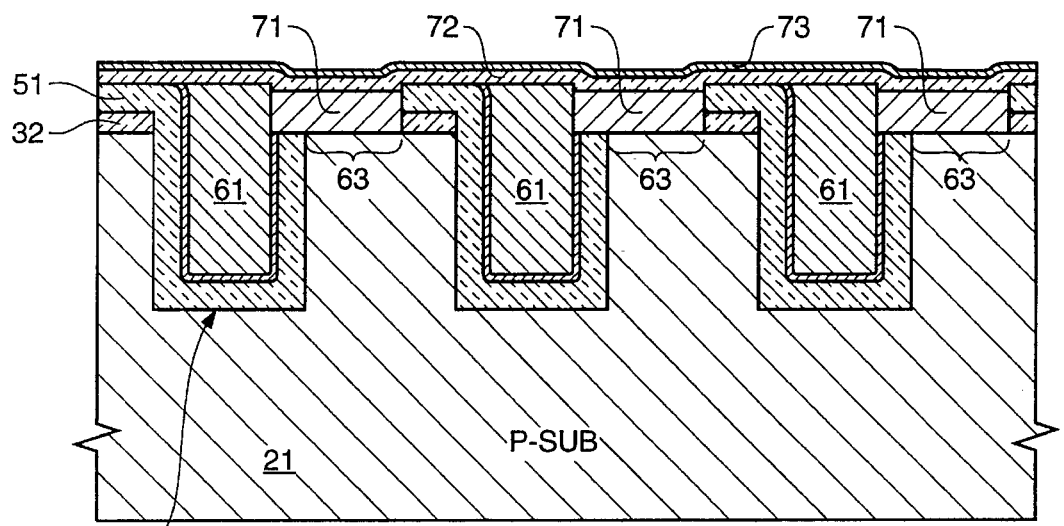
Figure 7B:
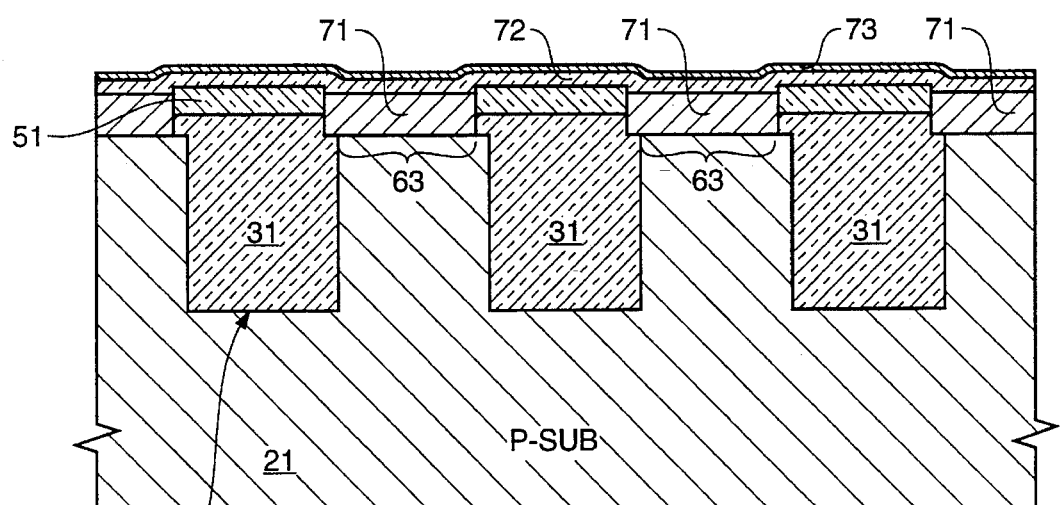
Figure 8A:
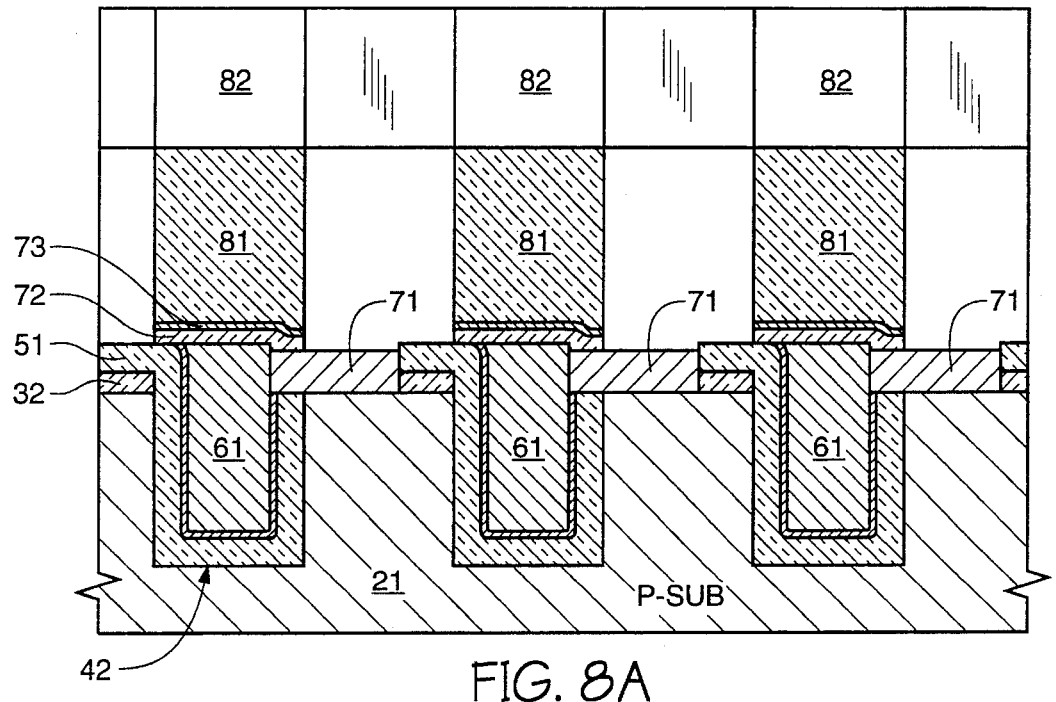
Figure 8B:
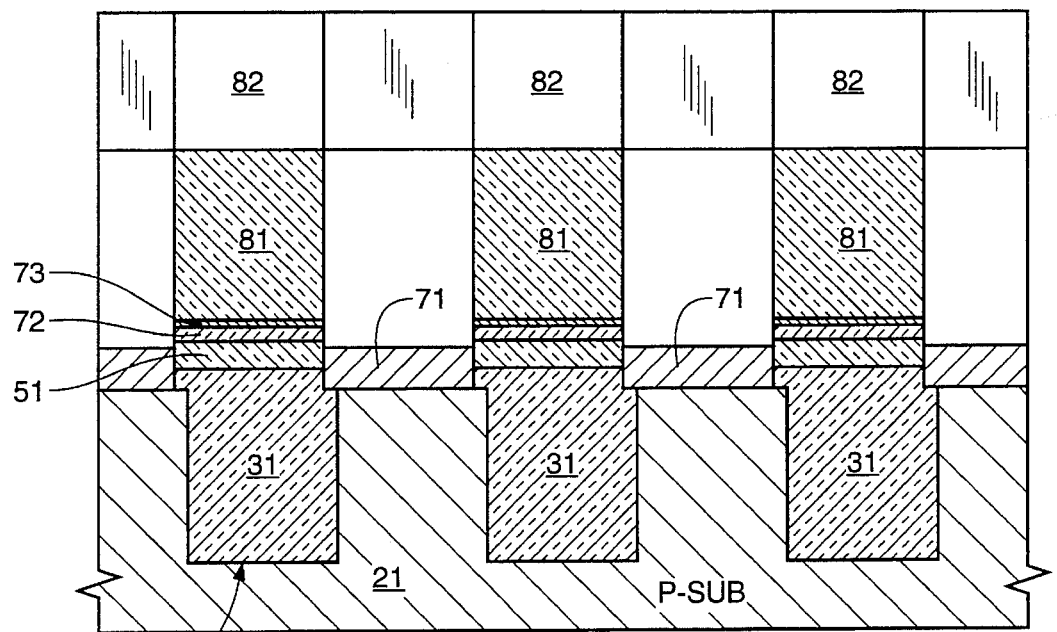
Figure 9A:
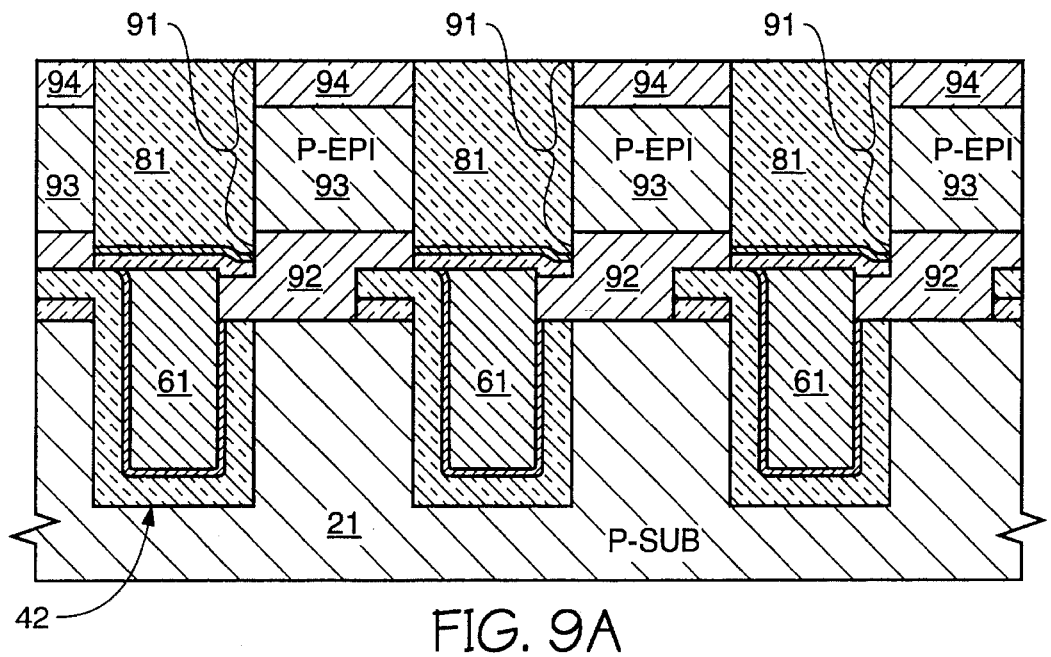
Figure 9B:
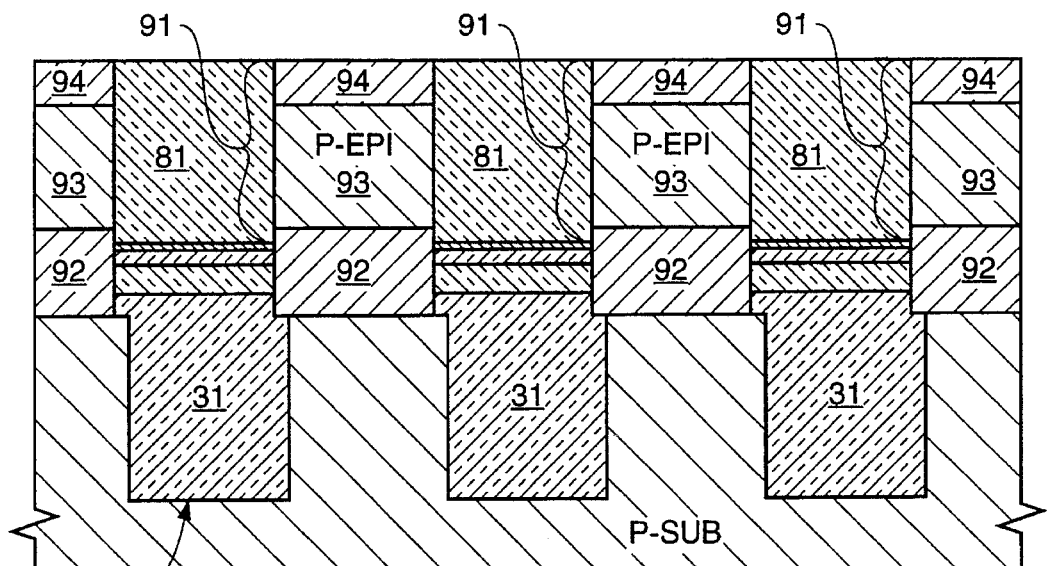
Figure 10A:
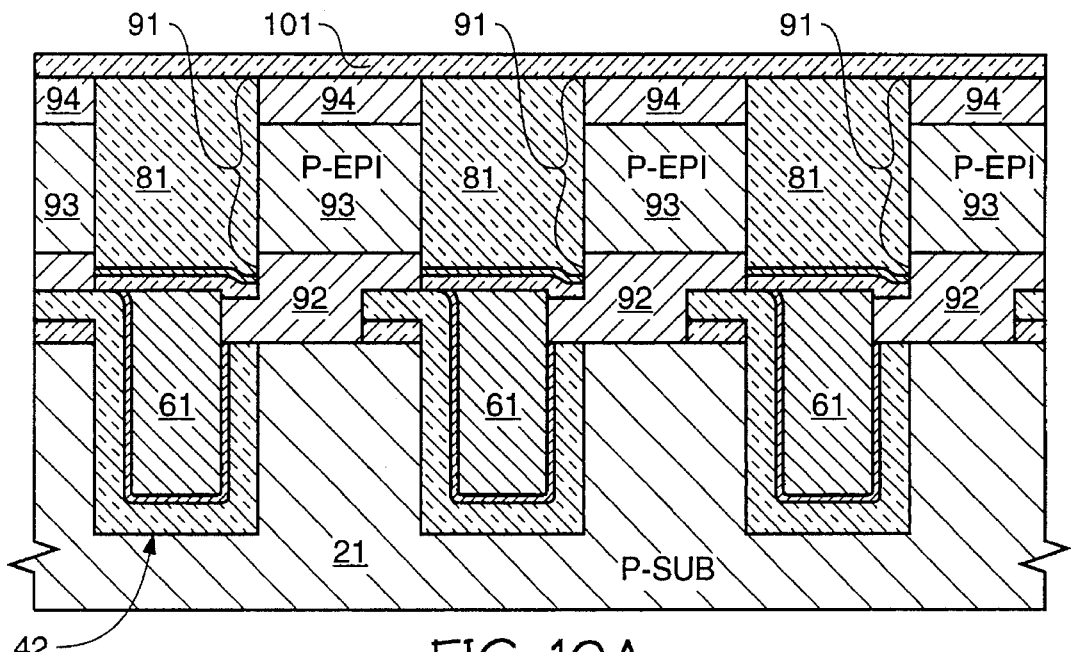
Figure 10B:
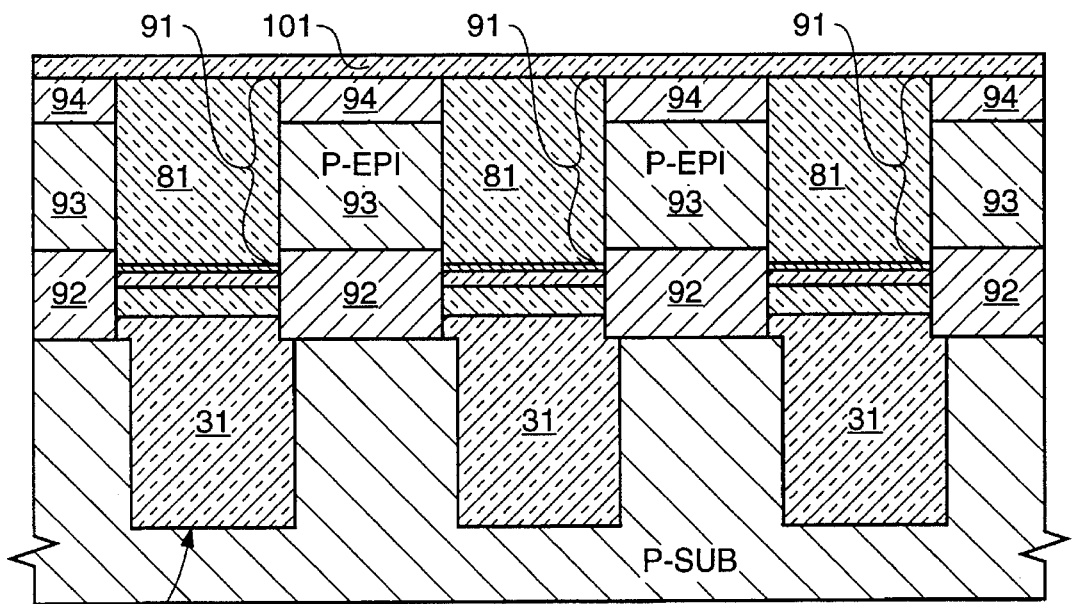
Figure 11A:
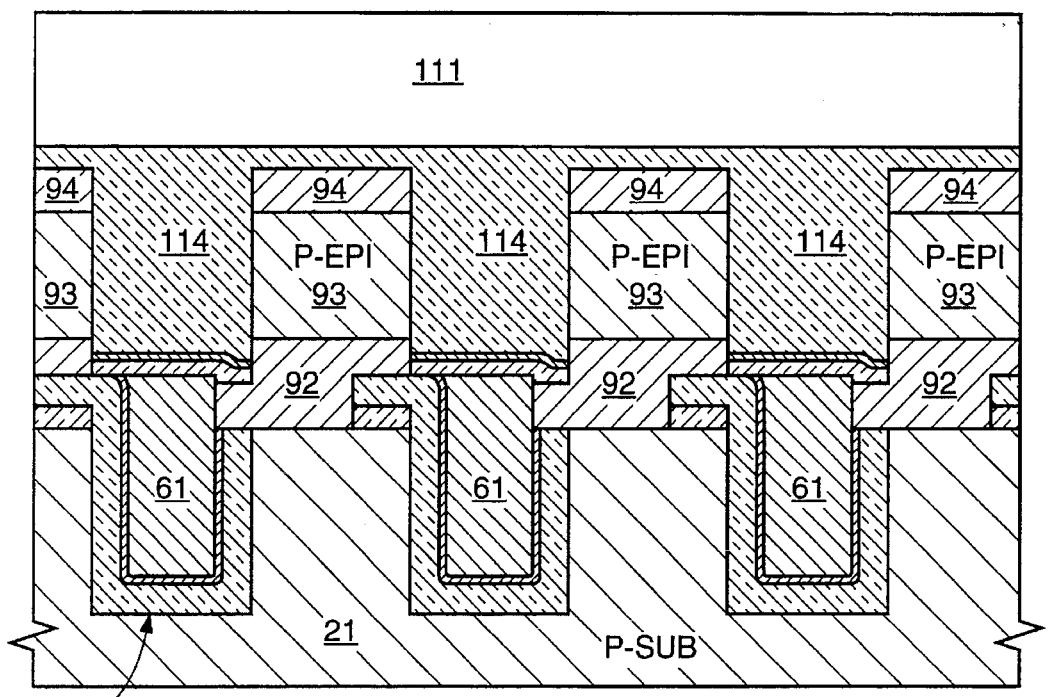
Figure 11B:
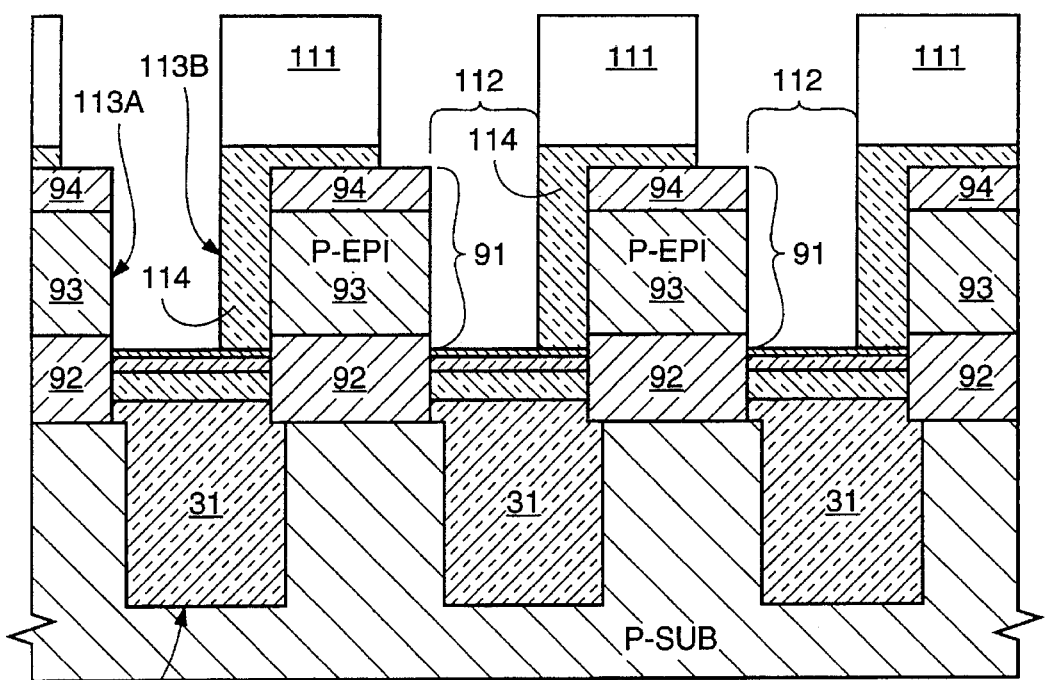
Figure 12A:
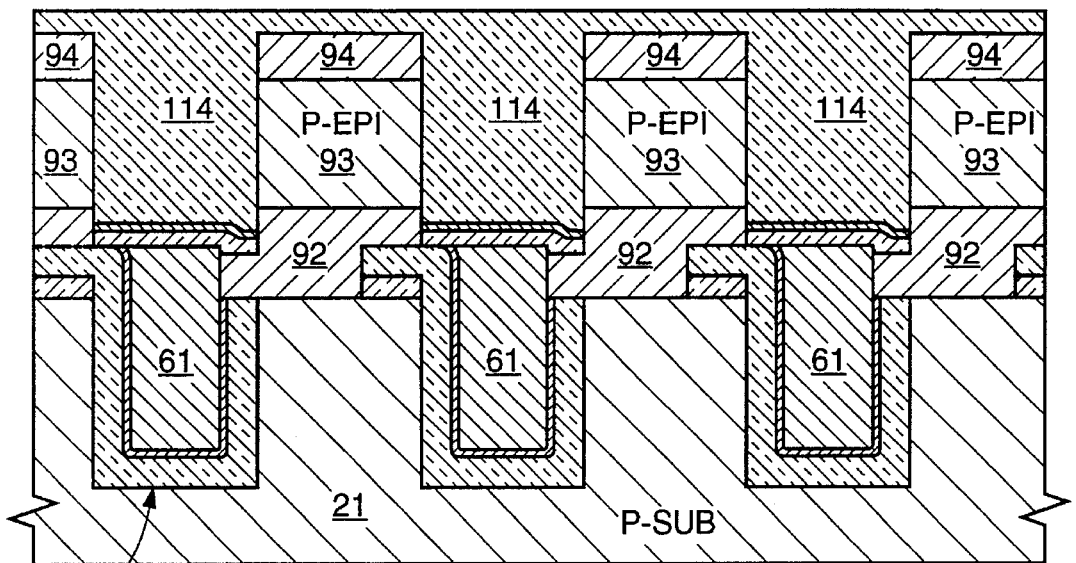
Figure 12B:
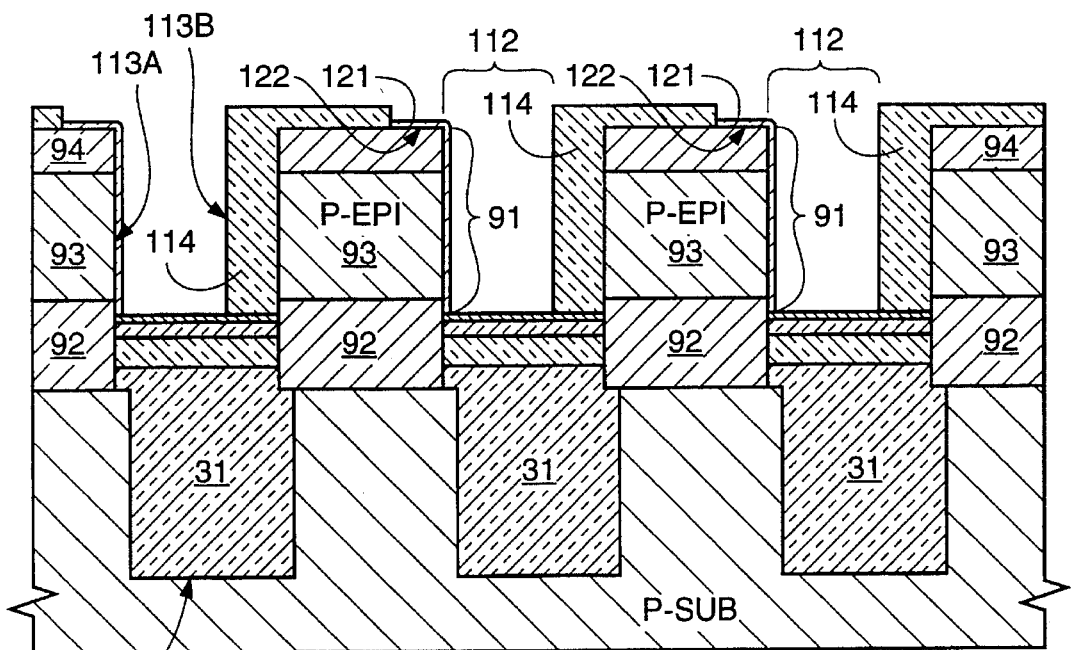
Figure 13A:
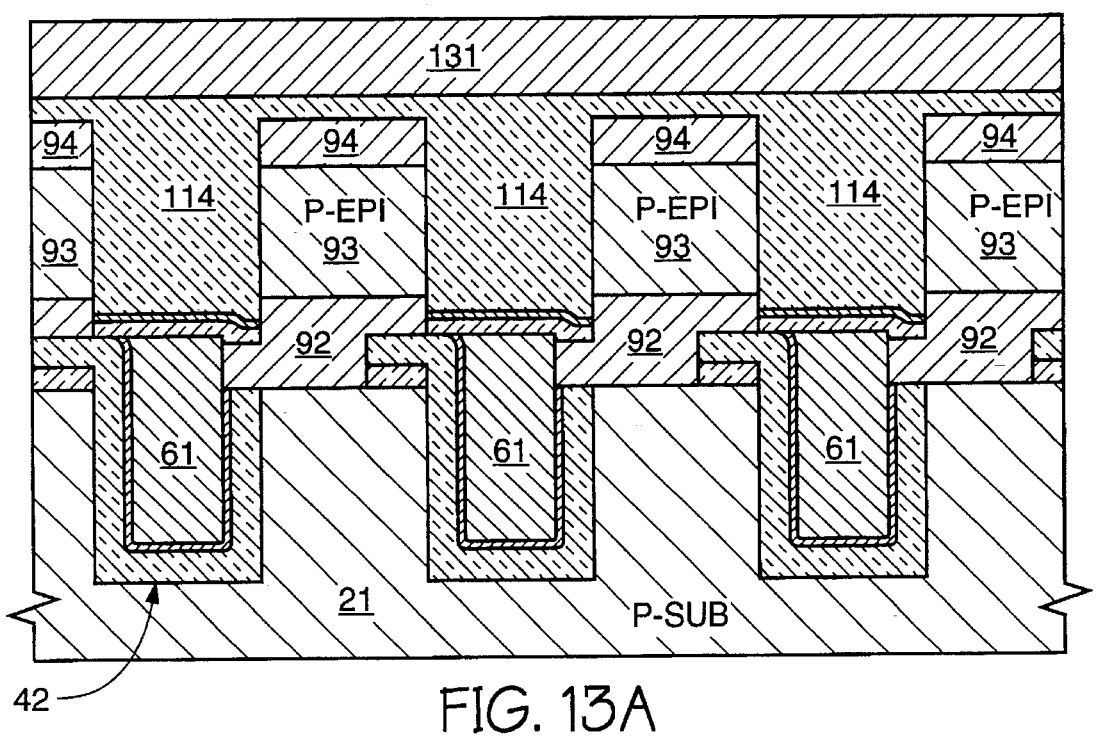
Figure 13B:
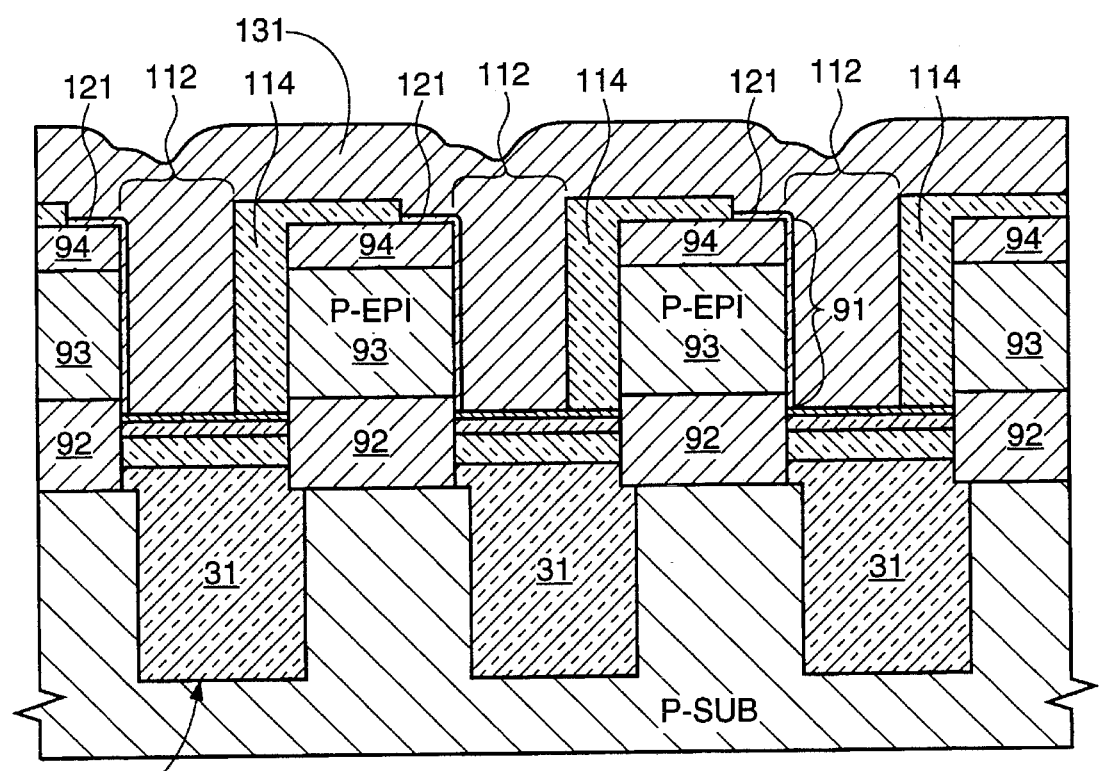
Figure 14A:
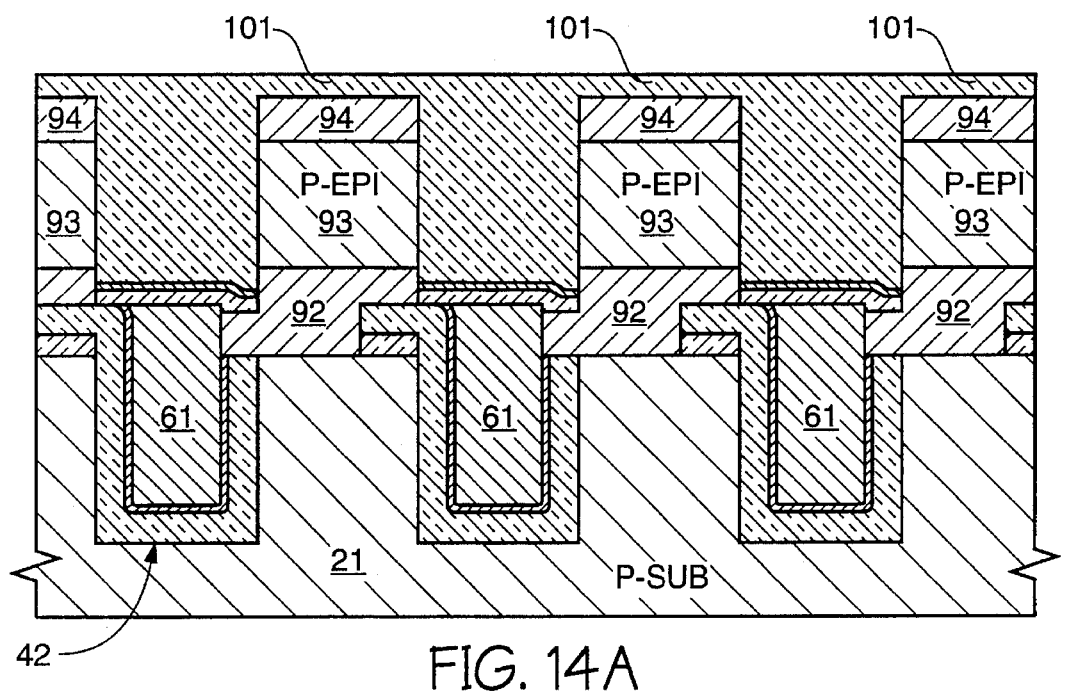
Figure 14B:
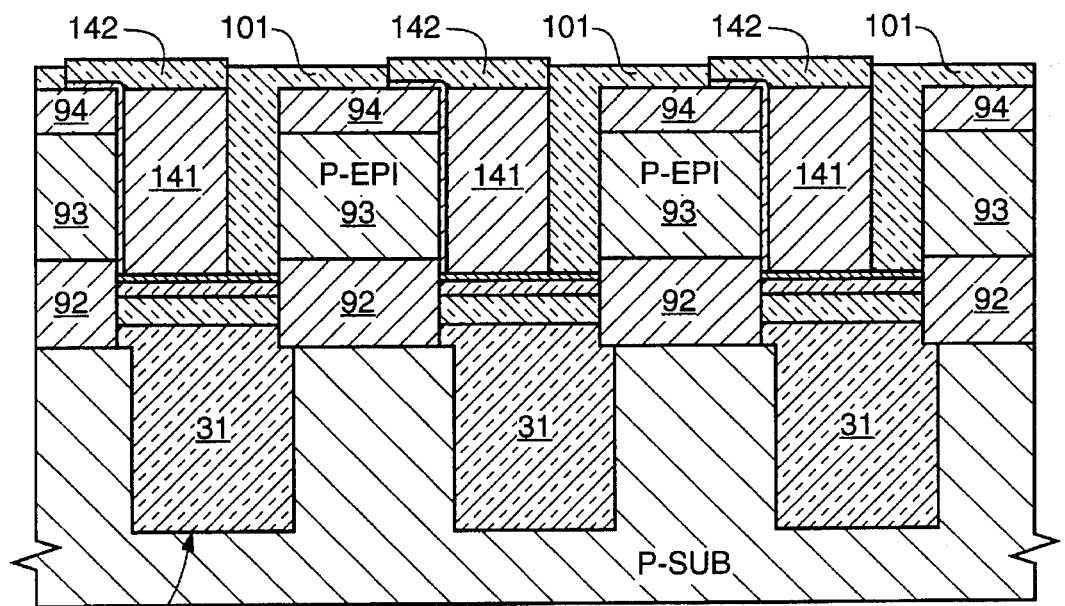
Figure 15A:
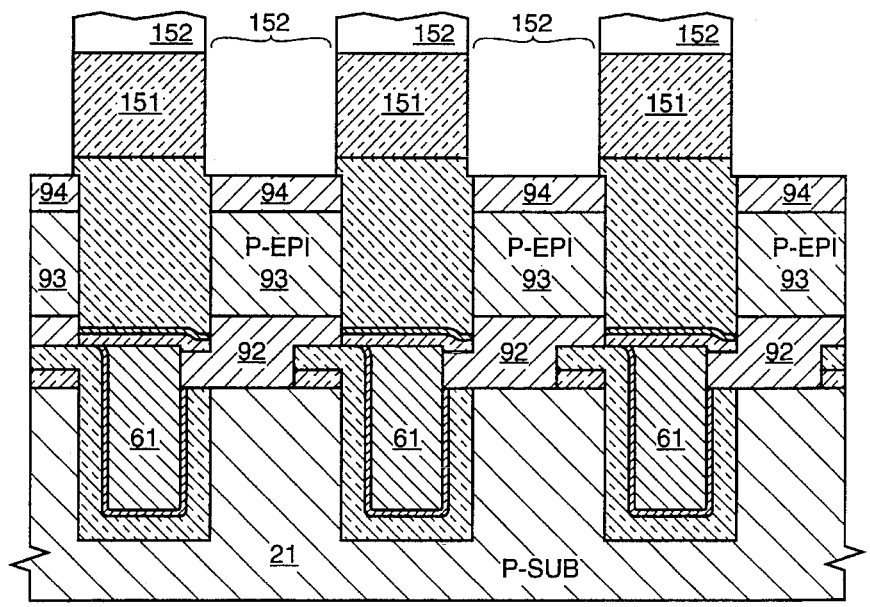
Figure 15B:
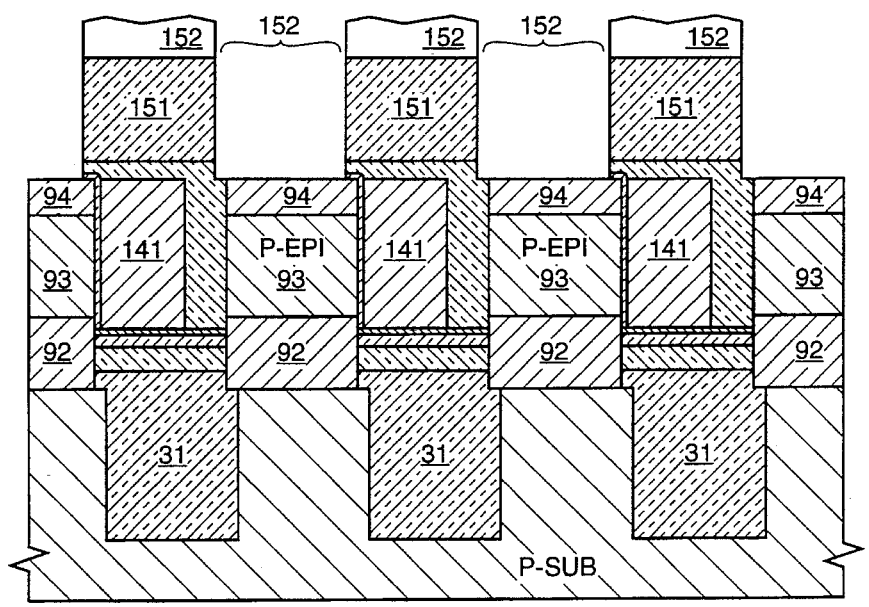
Figure 16A:
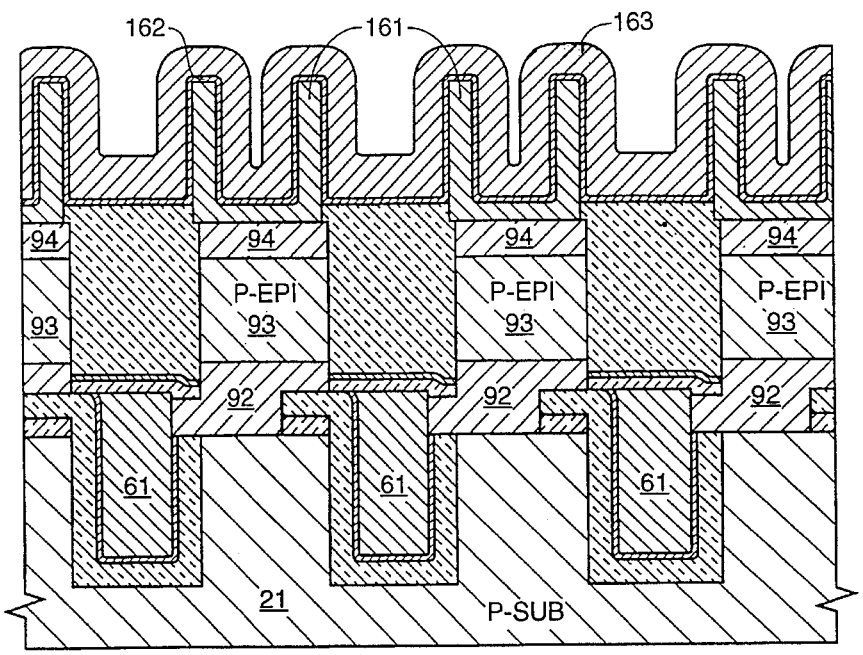
Figure 16B:
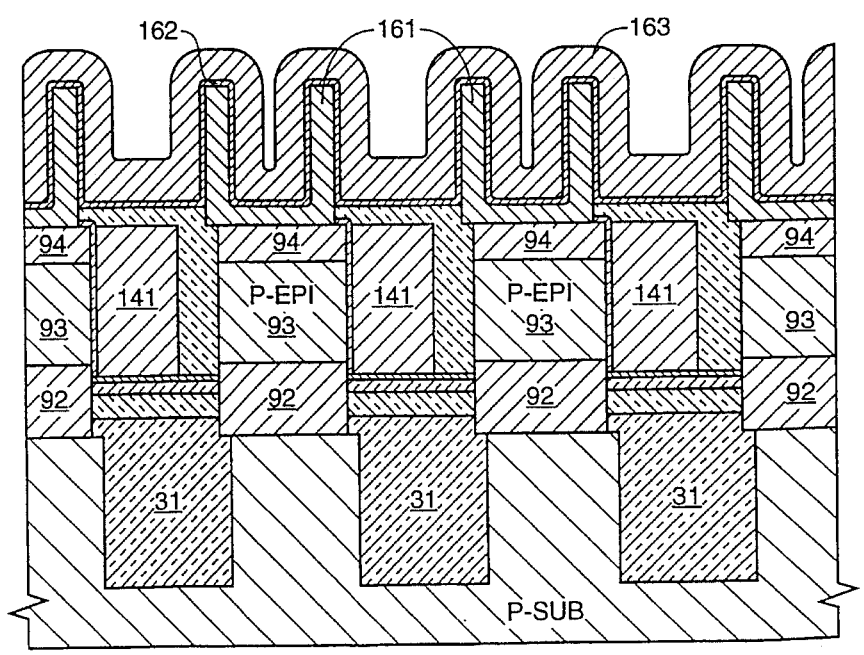

FIGS. 2A and 2B are cross-sectional views of an in-process P-type silicon wafer which has been patterned with photoresist and anisotropically etched to form a series of parallel trenches in a direction that is perpendicular to the future digit lines;

FIGS. 3A and 3B are respective cross-sectional views of the in-process wafer portion of FIGS. 2A and 2B following the deposition of a first silicon dioxide layer and a subsequent planarization step;

FIGS. 4A and 4B are respective cross-sectional views of the in-process wafer portion of FIGS. 3A and 3B following a patterning with photoresist and an anisotropic etch which forms a series of parallel trenches in a direction that is perpendicular to the future word lines;

FIGS. 5A and 5B are respective cross-sectional views of the in-process wafer portion of FIGS. 4A and 4B following the sequential deposition of a second silicon dioxide layer, a "glue" layer, and a CVD tungsten layer;

FIGS. 6A and 6B are respective cross-sectional views of the in-process wafer portion of FIGS. 5A and 5B following a chemical mechanical polishing step which forms individual digit lines by removing all tungsten except that which in the trenches, masking and etching the array so as to remove a grid of patches consisting of portions of said first and second silicon dioxide layers, thus exposing a portion of the substrate and the edge of one digit line where each patch has been removed;

FIGS. 7A and 7B are respective cross-sectional views of the in-process wafer portion of FIGS. 6A and 6B following a first selective epitaxial growth (SEG) step that forms a heavily-doped N-type single crystal silicon plate which overlies the substrate and also makes contact with a vertical edge of the digit line, and the subsequent deposition of a third silicon dioxide layer and, then, an etch-stop layer;

FIGS. 8A and 8B are respective cross-sectional views of the in-process wafer portion of FIGS. 7A and 7B following the deposition of a fourth silicon dioxide layer (also referred to as the first mold layer), which is subsequently patterned and etched to form a grid of apertures, each aperture of which exposes an epitaxially-grown N-type single crystal silicon plate, but does not expose a digit line;

FIGS. 9A and 9B are respective cross-sectional views of the in-process wafer portion of FIGS. 8A and 8B following a second SEG step that increases the thickness of the heavily-doped N-type plate previously formed by SEG within each aperture, subsequently forms a lightly-doped P-type layer superjacent the heavily-doped N-type layer, and finally forms a second heavily-doped N-type plate superjacent the lightly-doped P-type layer;

FIGS. 10A an 10B are respective cross-sectional views of the in-process wafer portion of FIGS. 9A and 9B following the deposition of a fifth silicon dioxide layer;

FIGS. 11A and 11B are respective cross-sectional views of the in-process wafer portion of FIGS. 10A and 10B following a masking step and the etching of a series of parallel channels in the first mold layer perpendicular to the digit lines;

FIGS. 12A and 12B are cross-sectional views of the inprocess wafers portion of FIGS. 11A and 11B, respectively, following the growth of a gate oxide layer;

FIGS. 13A and 13B are respective cross-sectional views of the in-process wafer portion of FIGS. 12A and 12B following the deposition of an insitu doped first polysilicon layer;

FIGS. 14A and 14B are respective cross-sectional views of the in-process wafer portion of FIGS. 13A and 13B following a chemical mechanical polishing step which forms individual word lines and the subsequent thermal oxidation of the upper surface of the word lines;

FIGS. 15A and 15B are respective cross-sectional views of the in-process wafer portion of FIGS. 14A and 14B following the deposition of a second silicon dioxide mold layer, subsequent masking and etching of the second mold layer to form depressions, each of which exposes a second heavily-doped N-type plate; and FIGS. 16A and 16B are respective cross-sectional views of the in-process wafer portion of FIGS. 15A and 15B following the deposition of a second polysilicon layer, coating of the array with photoresist and performing an etch-back step which forms individual storage-node capacitor plates, a subsequent etch-back of the mold layer, formation of a capacitor dielectric layer and, finally, the formation of a cell plate layer.

PREFERRED EMBODIMENT OF THE INVENTION

Referring now to FIG. 1, the layout of the new DRAM cell array shows the relative position of the various array components in a top plan view. In this array portion, three digit lines 61 are below and normal to three word lines 141. Each of the word lines 141 runs within a channel (not shown in this view) between rows of vertical SEG-silicon transistor towers 91. On one side of each word line 141, a gate dielectric layer 121 is interposed between a word line 141 and a row of adjacent transistor towers 91 so that a signal voltage on the word line 141 will invert the channels of the adjacent transistors (thus, turning them "ON"), while on the other side of a word line 141, there is a dielectric spacer 114 having sufficient thickness to prevent a signal voltage on the word line from activating the transistors adjacent the spacer. It should be understood that both word lines and digit lines extend throughout the array, and that connections to peripheral circuitry are made outside the array. A storage node capacitor plate 163 (one for each memory cell) is centered over each transistor tower 91.

A process for fabricating the new cross-point DRAM cell array is depicted in FIGS. 2 through 16. The process begins with a bare P-type substrate or wafer in FIG. 2 and ends with capacitor formation in FIG. 16.

Referring now to FIGS. 2A and 2B, a P-type silicon substrate 21 has been patterned with a first photoresist mask 22 and anisotropically etched to form a first series of parallel trenches 23, with those trenches oriented such that they will be perpendicular to the future digit lines.

Referring now to FIGS. 3A and 3B, the in-process wafer portion of FIGS. 2A and 2B has been subjected to the deposition of a first silicon dioxide layer 31 which fills the first series of parallel trenches 23. The first silicon dioxide layer 31 is then planarized (preferably via chemical mechanical polishing) so as to leave a thin silicon dioxide layer 32 covering the upper surface of substrate 21 and the trenches 23 filled with the silicon dioxide material.

Referring now to FIGS. 4A and 4B, the in-process wafer portion of FIGS. 3A and 3B has been patterned with a second photoresist mask 41 and anisotropically etched to form a second series of parallel trenches 42 which perpendicularly intersect the first series of silicon-dioxide-filled first series of parallel trenches 13.

Referring now to FIGS. 5A and 5B, the in-process wafer portion of FIGS. 4A and 4B have been subjected to the deposition of a second silicon dioxide layer 51 which lines the second series of parallel trenches 42. A "glue" layer 52 is then deposited on top of the second silicon dioxide layer 51. The glue layer may be (but is not limited to) tungsten or CVD titanium nitride. A CVD tungsten layer 53 is then deposited on top of the glue layer 52. The tungsten layer 53 is of sufficient thickness to completely fill the oxide-lined second series of parallel trenches 42. The glue layer 52 provides good adhesion between the second silicon dioxide layer 51 and the CVD tungsten layer 53.

Referring now to FIGS. 6A and 6B, the in-process wafer portion of FIGS. 5A and 5B are subjected to a chemical mechanical polishing step which removes all tungsten of CVD tungsten layer 53 except that which is in the oxide-lined second series of parallel trenches 42, thus forming a series of parallel tungsten digit lines 61 which are insulated from the substrate 21 by second silicon dioxide layer 51. The in-process DRAM array portions are then masked with a third photoresist mask 62. A subsequent oxide etch step removes a silicon dioxide patch (which includes portions of both first silicon dioxide layer 31 and second silicon dioxide layer 51) in a future selective epitaxial growth region 63 that is adjacent one edge of each digit line 61 at each future memory cell location.

Referring now to FIGS. 7A and 7B, the in-process wafer portion of FIGS. 6A and 6B have been subjected to a first selective epitaxial growth (SEG) step in order to form heavily-doped N-type single crystal silicon plates 71, each of which overlies the substrate 21 in an epitaxial growth regions 63. Each single crystal silicon plate 71 also makes contact with a vertical edge of a digit line 61. The N-type doping may be accomplished either in-situ (this is the preferred method, as the doping is accomplished during the SEG step) or by implantation or diffusion following deposition. The wafer is then subjected to the deposition of a third silicon dioxide layer 72 and an etch stop layer 73, which may be, for example, silicon nitride.

Referring now to FIGS. 8A and 8B, the in-process wafer portion of FIGS. 7A and 7B have been subjected to the deposition of a fourth silicon dioxide layer 81 (also referred to as the first mold layer). The fourth silicon dioxide layer 81 is masked with a fourth photoresist mask 82 and anisotropically etched to form a grid-like pattern having rows and columns of apertures 83 therein. Each aperture exposes an SEG silicon plate 71 at an individual cell location. None of the apertures exposes a digit line 61.

Referring now to FIGS. 9A and 9B, the in-process wafer portion of FIGS. 8A and 8B is subjected to a second SEG step combined with insitu doping. A transistor tower 91 is thus formed within each aperture 83. The thickness of each heavily-doped N-type plate 71 is increased so as to form a lower source/drain region 92 for the individual cell access transistors. A lightly-doped P-type layer 93 is subsequently grown on top of each lower source/drain region 92 (each lightly-doped P-type SEG layer 93 will become a cell access transistor channel region). Finally, a second heavily-doped N-type plate or upper source/drain region 94 is grown superjacent each lightly-doped P-type layer 93. Insitu doping is, of course, modified during the second SEG step to provide appropriate doping types and concentration levels. Alternatively, the upper source/drain region 94 may be formed by extending the length of the lightly-doped P-type layer to also encompass a thickness corresponding to both the channel length and the desired thickness of the upper source/drain region, and then implanting an N-type impurity into the lightly-doped P-type layer 93. The implanting of the N-type impurity may be performed either prior to the deposition of the fifth silicon dioxide layer 101 (depicted in FIGS. 10A and 10B) or after the formation of depressions 153 in which will be constructed the storage node plates (depicted in FIGS. 15A and 15B).

Referring now to FIGS. 10A and 10B, the in-process wafer portion of FIGS. 9A and 9B has been subjected to the deposition of a fifth silicon dioxide layer 101 which covers the upper surface of each upper source/drain region 94. The results in either case are equivalent.

Referring now to FIGS. 11A and 11B, the in-process wafer portion of FIGS. 10A and 10B is masked with a fifth photoresist mask 111, following which an anisotropic etch is employed to etch away a portion of the first mold layer 81 so as to form a series of parallel channels 112 which are preferably centered over the first series of trenches 23 and also perpendicular to the digit lines 61. The series of parallel channels 112 run between adjacent rows of transistor towers 91. The fifth photoresist mask 111 is designed to that the anisotropic etch exposes the left-side vertical surface 113A of each transistor tower 91, while leaving the right-side vertical surface 113B of each transistor tower 91 covered with a thick silicon dioxide spacer layer 114.

Referring now to FIGS. 12A and 12B, the in-process wafer portion of FIGS. 11A and 11B is subjected to a thermal oxidation step, which forms a silicon dioxide gate dielectric layer 121 on the on the exposed left-side vertical surface of each transistor tower 113. Notice also that the gate oxide layer also extends to an upper surface edge 122 of each transistor tower 113. For optimum array performance, the spacer layer 114 is at least an order of magnitude thicker than the gate dielectric layer 121.

Referring now to FIGS. 13A and 13B, the in-process wafer portion of FIGS. 12A and 12B has been subjected to the deposition of an insitu-doped polysilicon layer 131, which completely fills each of said parallel channels 112.

Referring now to FIGS. 14A and 14B, the in-process wafer portion of FIGS. 13A and 13B have been subjected to a chemical-mechanical polishing (CMP) step, which has formed individual word lines 141. For the CMP step, a slurry is chosen that removes polysilicon but that stops on the uppermost level of the fifth silicon dioxide layer 101. The exposed Upper surface of the polysilicon word lines 141 is then oxidized to form an insulating oxide layer 142 that protrudes above the uppermost level of the fifth silicon dioxide layer 101.

Referring now to FIGS. 15A and 15B, the in-process wafer portion of FIGS. 14A and 14B is subjected to the deposition of a sixth silicon dioxide layer (also referred to as the second mold layer) 151 and a subsequent masking with a sixth photoresist mask 152. The second mold layer 151 is then anisotropically etched to form a depression 153 at each cell location. Each depression exposes an upper source/drain region 93.

Referring now to FIGS. 16A and 16B, the in-process wafer portion of FIGS. 15A and 15B has been subjected to the deposition of a second polysilicon layer (not shown), coating with an unbroken photoresist layer (not shown), and a subsequent etch-back step which forms individual cup-shaped storage-node capacitor plates 161. The second mold layer 151 is then etched back (preferably with a wet etch), and the cell capacitors are completed by forming a capacitor dielectric layer 162 (most commonly by depositing a silicon nitride layer), and by subsequently depositing a polysilicon cell plate layer 163. The cell plate layer is preferably doped insitu, but may be doped by other well known techniques, such as diffusion.

Although a DRAM array having N-channel transistors is considered to be the preferred embodiment because of speed considerations, one having ordinary skill in the art of semiconductor manufacture will realize that an equivalent DRAM memory array having P-channel transistors may be fabricated by simply using an N-type substrate and heavily-doped P-type source/drain regions. Additionally, although a container-type cell capacitor is considered to be the preferred configuration, it should be understood that this process flow is merely illustrative, and that other types of stacked capacitors may be used with the disclosed cell array.

Although only a single embodiment of the new cross-point DRAM cell array has been disclosed herein, it will be obvious to those having ordinary skill in the art of semiconductor memory manufacture that modifications and changes may be made to both the process and the structure without departing from the scope and spirit of the invention as set forth in the appended claims.

What is claimed is;

1. A dynamic random access memory array fabricated on a semiconductor substrate comprising:
    (a) a series of parallel metal digit lines, each digit line being at least partially buried within a dielectrically lined trench in the substrate; and
    (b) a plurality of individual memory cells arranged in a cross-point layout, each cell having both a cell capacitor located at a level that is above the digit lines and an insulated-gate field-effect access transistor, said transistor having first and second source/drain regions and a vertical channel, said source/drain regions and said channel being formed in expitaxially-grown semiconductor material, said transistor selectively coupling the capacitor to one of said digit lines.

2. The dynamic random access memory array of claim 1, wherein the epitaxially-grown semiconductor material and said substrate pertain to the same crystal.

3. The dynamic random access memory array of claim 2, wherein said first source/drain region is directly coupled to the capacitor, and said second source/drain region is directly coupled to one of the digit lines.

4. The dynamic random access memory array of claim 3, wherein said second source/drain region is immediately adjacent one of the digit lines, making intimate contact with a vertical surface of the digit line to which it is immediately adjacent.

5. The dynamic random access memory array of claim 4, wherein said first source/drain region is immediately subjacent its associated cell capacitor.

6. The dynamic random access memory array of claim 5, wherein an upper surface of each of said digit lines is overlaid with a dielectric layer.

7. The dynamic random access memory array of claim 1, wherein said semiconductor substrate is P-type single-crystal silicon, the individual access transistors are N-channel devices, and the trenches in which the digit lines are buried are lined with silicon dioxide.

8. An array of dynamic random access memory cells fabricated on a single-crystal semiconductor substrate, each cell comprising a vertical access transistor, each transistor having a channel region and first and second source/drain regions, said channel region and said source/drains regions being formed from selectively-grown, epitaxial silicon that is part of the substrate crystal which further comprises a series of parallel metal digit lines, each digit line being at least partially buried within a dielectrically lined trench in the substrate.

9. The dynamic random access memory array of claim 8, wherein said memory cells are arranged in a cross-point layout.

10. The dynamic random access memory array of claim 1, wherein the metal from which the digit lines are formed comprises tungsten.

11. The dynamic random access memory array of claim 8, wherein the metal from which the digit lines are formed comprises tungsten.

12. The dynamic random access memory array of claim 8, wherein each cell further comprises a capacitor constructed superjacent the vertical access transistor.

13. The dynamic random access memory array of claim 11, wherein said first source/drain region is directly coupled to the capacitor and said second source/drain region is directly coupled to an adjacent digit line.

14. The dynamic random access memory array of claim 13, wherein each access transistor further comprises a gate electrode and a planar gate dielectric layer, said planar gate dielectric layer being interposed between said gate electrode and said channel region.

15. The dynamic random access memory array of claim 8, wherein an upper surface of each of said digit lines is overlaid with a dielectric layer.

16. A dynamic random access memory array fabricated on a single-crystal semiconductor substrate comprising:
    (a) a series of parallel metal digit lines, each digit line being at least partially buried within a dielectrically lined trench in the substrate; and
    (b) a plurality of individual memory cells arranged in a cross-point layout, each cell having both a cell capacitor located at a level that is above the digit lines and an insulated-gate field-effect access transistor, said transistor having a first source/drain region coupled to said capacitor, a second source/drain region coupled to one of said digit lines, and a vertical channel, said source/drain regions and said channel being formed in expitaxially-grown semiconductor material that is part of the single crystal which constitutes the substrate, said transistor selectively coupling the capacitor to one of said digit lines.

17. The dynamic random access memory array of claim 16, wherein no capacitor is constructed such that is centered about a plane which bisects a digit line and is normal to the substrate.

18. The dynamic random access memory array of claim 17, wherein said vertical channel is superjacent the second source/drain region and said first source/drain region is superjacent the vertical channel.

19. The dynamic random access memory array of claim 18, wherein said second source/drain region is immediately adjacent one of the digit lines, making intimate contact with a vertical surface of the digit line to which it is immediately adjacent.

* * * * *

UNITED STATES PATENT AND TRADEMARK OFFICE
CERTIFICATE OF CORRECTION

PATENT NO    : 5,497,017
DATED        : Mar. 5, 1996
INVENTOR(S)  : Fernando Gonzales It is certified that error appears in the above-identified patent and that said Letters Patent is hereby corrected as shown below:

On the title page:

The last name of the inventor, "Gonzales" should read --Gonzalez--.

Signed and Sealed this

Twenty-eighth Day of July, 1998

*Attest:*

BRUCE LEHMAN

*Attesting Officer*  Commissioner of Patents and Trademarks

UNITED STATES PATENT AND TRADEMARK OFFICE
CERTIFICATE OF CORRECTION

PATENT NO. : 5,497,017
DATED : March 5, 1996
INVENTOR(S) : Gonzalez

It is certified that error appears in the above-identified patent and that said Letters Patent is hereby corrected as shown below:

Title page,
The last name of the inventor, "Gonzales" should read -- Gonzalez --.

Column 1,
Line 59, delete the comma after "Although";

Column 2,
Line 29, after "which" insert -- is --;

Column 3,
Line 1, change "dross" to -- cross --;
Line 23, before "in" at the beginning of the line, insert -- is --;
Line 50, after "10A" change "an" to -- and --;
Line 59, change "inprocess" to -- in-process -- and change "wafers" to -- wafer --;
Line 63, change "insitu" to -- in situ --;

Column 4,
Line 63, change "intersect" to -- intersects -- and insert a comma after "filled";
Line 64, delete "first series of" and change "13" to -- 23 --;

Column 5,
Line 11, after "5B" change "are" to -- is --;
Line 25, change "have" to -- has --;
Line 38, change "have" to -- has --;
Line 48, change "insitu" to -- in situ --;
Line 57, change "Insitu" to -- In situ --;

Column 6,
Line 13, after "which" change "are" to -- is --;
Line 16, after "112" change "run" to -- runs --;
Line 17, after "designed" change "to" to -- so --;
Line 25, delete "on the" (2nd occurrence);
Line 26, change "113" to -- 91 --;
Line 28, change "113" to -- 91 --;
Line 33, change "insitu" to -- in situ --;
Line 36, change "have" to -- has --;
Line 41, change "Upper" to -- upper --;
Line 52, change "93" to -- 94 --;
Line 64, change "insitu" to -- in situ --;

UNITED STATES PATENT AND TRADEMARK OFFICE
CERTIFICATE OF CORRECTION

PATENT NO. : 5,497,017
DATED : March 5, 1996
INVENTOR(S) : Gonzalez

It is certified that error appears in the above-identified patent and that said Letters Patent is hereby corrected as shown below:

Column 7,
Line 29, change "expitaxially" to -- epitaxially --;
Line 53, after "are" insert -- at least partially --;
Line 59, change "drains" to -- drain --;

Column 8,
Lines 41-42, change "expitaxially" to -- epitaxially --;
Line 47, after "that" insert -- it --.

Signed and Sealed this

Sixth Day of November, 2001

*Attest:*

*Attesting Officer*

NICHOLAS P. GODICI
*Acting Director of the United States Patent and Trademark Office*